United States Patent
Bian et al.

(10) Patent No.: US 11,705,529 B2
(45) Date of Patent: Jul. 18, 2023

(54) PHOTODETECTORS INTEGRATED WITH AN INVERSE TAPER INCLUDING A CURVED TIP

(71) Applicant: GlobalFoundries U.S. Inc., Malta, NY (US)

(72) Inventors: Yusheng Bian, Ballston Lake, NY (US); Asif Chowdhury, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 8 days.

(21) Appl. No.: 17/551,544

(22) Filed: Dec. 15, 2021

(65) Prior Publication Data
US 2023/0187566 A1 Jun. 15, 2023

(51) Int. Cl.
- H01L 31/0232 (2014.01)
- H01L 31/18 (2006.01)
- H01L 31/0203 (2014.01)
- H01L 31/101 (2006.01)

(52) U.S. Cl.
CPC .... H01L 31/02327 (2013.01); H01L 31/0203 (2013.01); H01L 31/101 (2013.01); H01L 31/18 (2013.01)

(58) Field of Classification Search
CPC ................................................. G02B 6/1228
See application file for complete search history.

(56) References Cited

U.S. PATENT DOCUMENTS

| | | | |
|---|---|---|---|
| 7,095,920 B1 * | 8/2006 | Little | G02B 6/12002 385/14 |
| 7,616,904 B1 | 11/2009 | Gunn, III et al. | |
| 10,191,214 B2 * | 1/2019 | Dong | G02B 6/2773 |
| 10,585,245 B1 | 3/2020 | Bian et al. | |
| 10,818,807 B2 | 10/2020 | Jacob et al. | |
| 10,910,503 B1 | 2/2021 | Bian et al. | |

OTHER PUBLICATIONS

M. Rakowski et al., "45nm CMOS—Silicon Photonics Monolithic Technology (45CLO) for Next-Generation, Low Power and High Speed Optical Interconnects," 2020 Optical Fiber Communications Conference and Exhibition (OFC), pp. 1-3 (2020).

H. Chen, et al. , "-1 V bias 67 GHz bandwidth Si-contacted germanium waveguide p-i-n photodetector for optical links at 56 Gbps and beyond," Optics Express; vol. 24, No. 5; pp. 4622-4631 (Mar. 7, 2016).

(Continued)

*Primary Examiner* — Suberr L Chi
(74) *Attorney, Agent, or Firm* — Thompson Hine LLP; Anthony Canale

(57) ABSTRACT

Structures for a photodetector and methods of fabricating a structure for a photodetector. The structure includes a first waveguide core having a first taper, a semiconductor layer having a sidewall adjacent to the first taper, and a second waveguide core having a second taper that is positioned to overlap with the first taper and a curved section. The second taper is longitudinally positioned between the sidewall of the semiconductor layer and the curved section. The curved section terminates the second waveguide core.

20 Claims, 6 Drawing Sheets

(56) References Cited

OTHER PUBLICATIONS

S. Assefa et al., "CMOS-integrated 40GHz germanium waveguide photodetector for on-chip optical interconnects," 2009 Conference on Optical Fiber Communication, 2009, pp. 1-3, doi: 10.1364/OFC. 2009.OMR4 (2009).

Donghwan Ahn et al., "High performance, waveguide integrated Ge photodetectors," Optics Express, vol. 15, No. 7, pp. 3916-3921 (2007).

Kyle Preston et al., "Waveguide-integrated telecom-wavelength photodiode in deposited silicon," Optics Letters, vol. 36, No. 1, pp. 52-54 (Jan. 1, 2011).

K. Giewont et al., "300-mm Monolithic Silicon Photonics Foundry Technology," in IEEE Journal of Selected Topics in Quantum Electronics, vol. 25, No. 5, pp. 1-11, Art No. 8200611, doi: 10.1109/JSTQE.2019.2908790 (Sep.-Oct. 2019).

B. Peng et al., "A CMOS Compatible Monolithic Fiber Attach Solution with Reliable Performance and Self-alignment," in Optical Fiber Communication Conference (OFC), OSA Technical Digest (Optical Society of America, 2020), paper Th3I.4 (2020).

Y. Bian et al., "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optical Society of America, 2020), paper FW5D.2 (2020).

Y. Bian et al., "Monolithically integrated silicon nitride platform," in Optical Fiber Communication Conference (OFC), DSA Technical Digest (Optical Society of America, 2021), paper Th1A.46; pp. 1-3 (2021).

A. Aboketaf et al., "Towards fully automated testing and characterization for photonic compact modeling on 300-mm wafer platform," 2021 Optical Fiber Communications Conference and Exhibition (OFC), pp. 1-3 (2021).

Qian Li et al.; "Polarization-Insensitive Waveguide Schottky Photodetectors Based on Mode Hybridization Effects in Asymmetric Plasmonic Waveguides," Sensors 2020, vol. 20, Issue 23, 6885; doi:10.3390/s20236885; pp. 1-17 (2020).

Jurgen Michel et al.; "High-performance Ge-on-Si photodetectors," Nature Photonics, Focus Review Articles DOI:10.1038/NPHOTON. 2010.157; vol. 4; pp. 527-534 (Aug. 2010).

* cited by examiner

PHOTODETECTORS INTEGRATED WITH AN INVERSE TAPER INCLUDING A CURVED TIP

BACKGROUND

The disclosure relates to photonics chips and, more specifically, to structures for a photodetector and methods of forming a structure for a photodetector.

Photonics chips are used in many high-speed applications and systems including, but not limited to, data communication systems and data computation systems. A photonics chip integrates optical components, such as waveguides, optical switches, and directional couplers, and electronic components, such as field-effect transistors, into a unified platform. Among other factors, layout area, cost, and operational overhead may be reduced by the integration of both types of components on a single chip.

Photonics chips may include photodetectors that convert light, which may be modulated as an optical signal, into an electrical signal. A photodetector may suffer from mode mismatch and significant back reflection due to a refractive index mismatch between the light-absorbing material (e.g., germanium) of the photodetector and the material (e.g., silicon) of a waveguide core supplying the light to the light-absorbing material of the photodetector. The mode mismatch and back reflection degrade the coupling efficiency to the photodetector and thereby hinder the accurate extraction of photodetector performance. The coupling efficiency degradation increases if the light-absorbing material is formed on a thinned portion of the waveguide core. In particular, the responsivity of the photodetector to transverse magnetic polarized light may be low in comparison with the responsivity of the photodetector to transverse electric polarized light.

Improved structures for a photodetector and methods of fabricating a structure for a photodetector are needed.

SUMMARY

In an embodiment of the invention, a structure includes a first waveguide core having a first taper, a semiconductor layer having a sidewall adjacent to the first taper, and a second waveguide core having a curved section and a second taper that is positioned to overlap with the first taper. The second taper is longitudinally positioned between the sidewall of the semiconductor layer and the curved section. The curved section terminates the second waveguide core.

In an embodiment of the invention, a method includes forming a first waveguide core including a first taper, forming a semiconductor layer having a sidewall adjacent to the first taper, and forming a second waveguide core including a second taper that is positioned to overlap with the first taper and a curved section. The second taper is longitudinally positioned between the sidewall of the semiconductor layer and the curved section, and the curved section terminates the second waveguide core.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
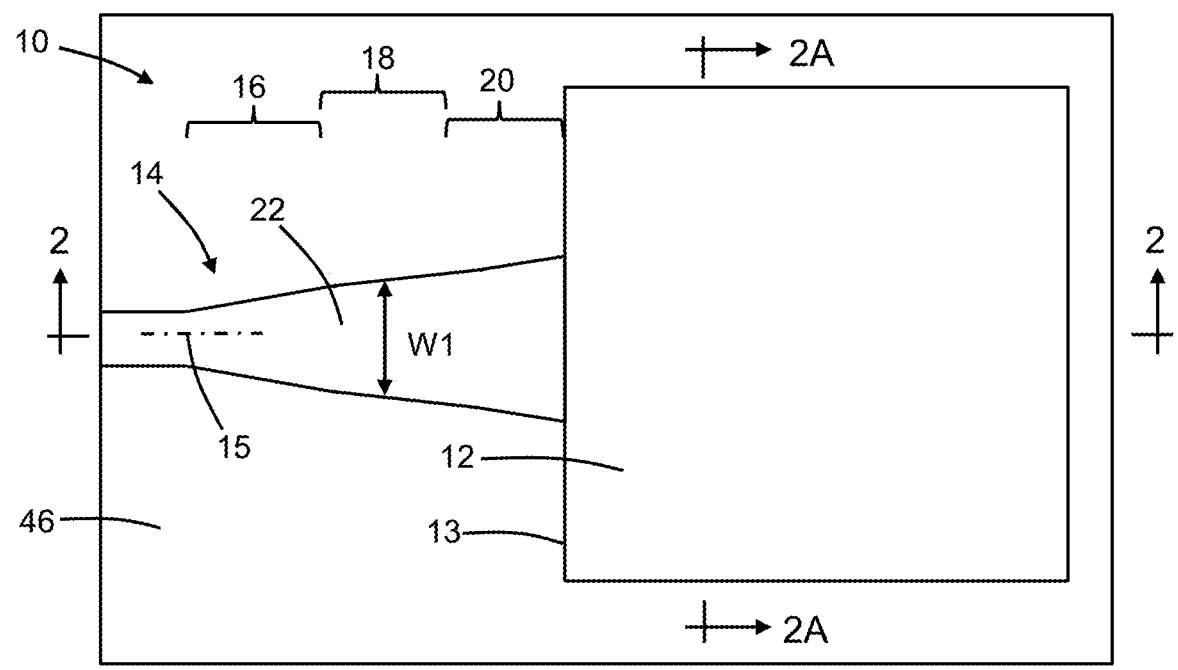
FIG. 1 is a diagrammatic top view of a structure at an initial fabrication stage of a processing method in accordance with embodiments of the invention.
Figure 2:
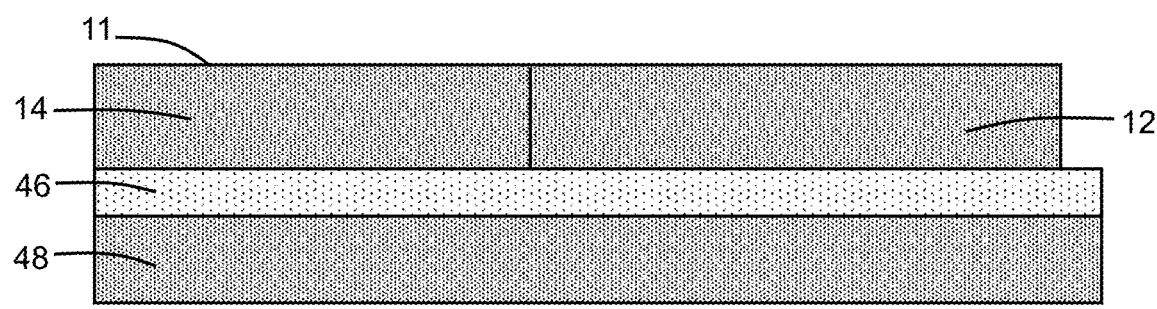
FIG. 2 is a cross-sectional view taken generally along line 2-2 in FIG. 1.
Figure 2A:
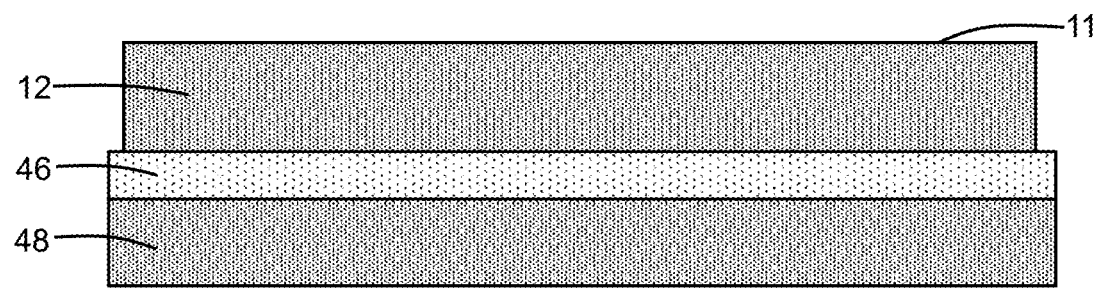
FIG. 2A is a cross-sectional view taken generally along line 2A-2A in FIG. 1.

With reference to FIGS. 1, 2, 2A and in accordance with embodiments of the invention, a structure 10 includes a pad 12 having a top surface 11 and a waveguide core 14 that is adjoined to the pad 12 at a side edge 13 of the pad 12. The pad 12 and waveguide core 14 may be comprised of a semiconductor material, such as a single-crystal semiconductor material (e.g., single-crystal silicon). In an embodiment, the pad 12 and waveguide core 14 may be patterned by lithography and etching processes from a layer of the semiconductor material. In an embodiment, the pad 12 and waveguide core 14 may be patterned from the device layer of a semiconductor-on-insulator substrate that further includes a dielectric layer 46 in the form of a buried oxide layer and a handle substrate 48. In an alternative embodiment, the pad 12 and waveguide core 14 may be patterned from the device layer by lithography and etching processes without etching fully through the device layer to initially form an unpatterned slab layer and, subsequently, the slab layer may be patterned with a separate set of lithography and etching processes from the partially-etched portions of the device layer.

The waveguide core 14 may include a taper 22 that adjoins the pad 12 at the side edge 13. In an embodiment, the taper 22 may be segmented into tapered sections 16, 18, 20 that are serially arranged along a longitudinal axis 15 with the tapered section 18 longitudinally positioned between the tapered section 16 and the tapered section 20. In an embodiment, the tapered sections 16, 18, 20 may have unequal taper angles. The tapered section 20 may directly adjoin the pad 12, and the tapered section 16 may directly adjoin a non-tapered portion of the waveguide core 14.

The width dimension W1 of the taper 22 of the waveguide core 14 varies with position (i.e., tapers) along the longitudinal axis 15. In an embodiment, the width dimension W1 of the taper 22 may be considered to inversely taper in a direction of light propagation. In an embodiment, the width dimension W1 of the taper 22 may decrease with increasing distance from the pad 12. In an embodiment, the width dimension W1 of the tapered section 20 may decrease with increasing distance from the pad 12, the width dimension W1 of the tapered section 18 may decrease with increasing distance from the tapered section 20, and the width dimension W1 of the tapered section 16 may decrease with increasing distance from the tapered section 18. In an embodiment, the tapered sections 16, 18, 20 may have polygonal shapes. In an embodiment, the width dimension W1 of the tapered sections 16, 18, 20 may vary based on a linear function. In an alternative embodiment, the width dimension W1 of the tapered sections 16, 18, 20 may vary based on a non-linear function, such as a quadratic, parabolic, or exponential function.

Figure 3:
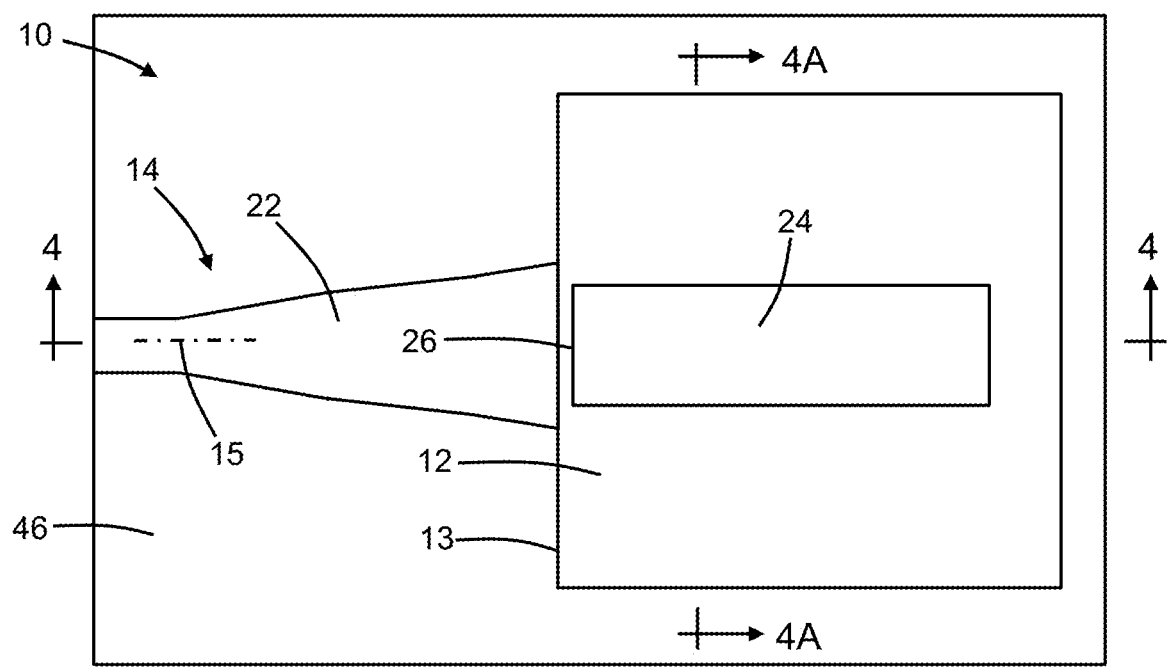
FIG. 3 is a top view of the structure at a fabrication stage of the processing method subsequent to FIG. 1.
Figure 4:
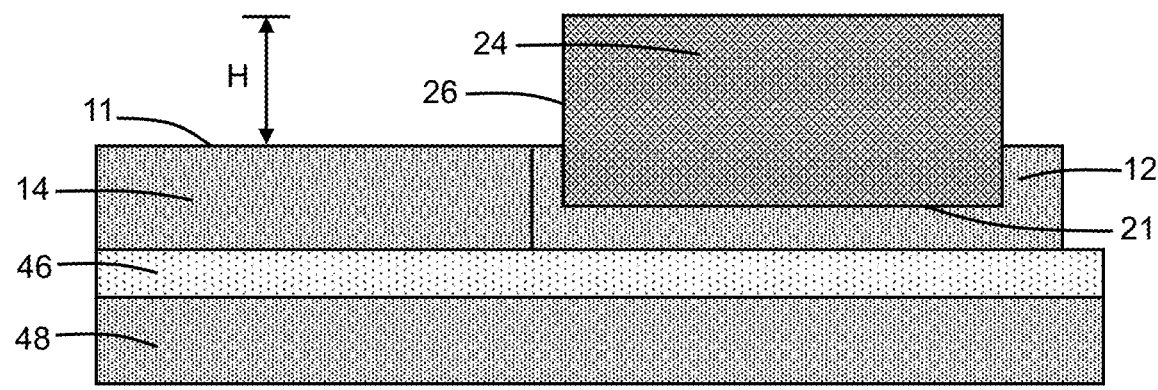
FIG. 4 is a cross-sectional view taken generally along line 4-4 in FIG. 3.
Figure 4A:
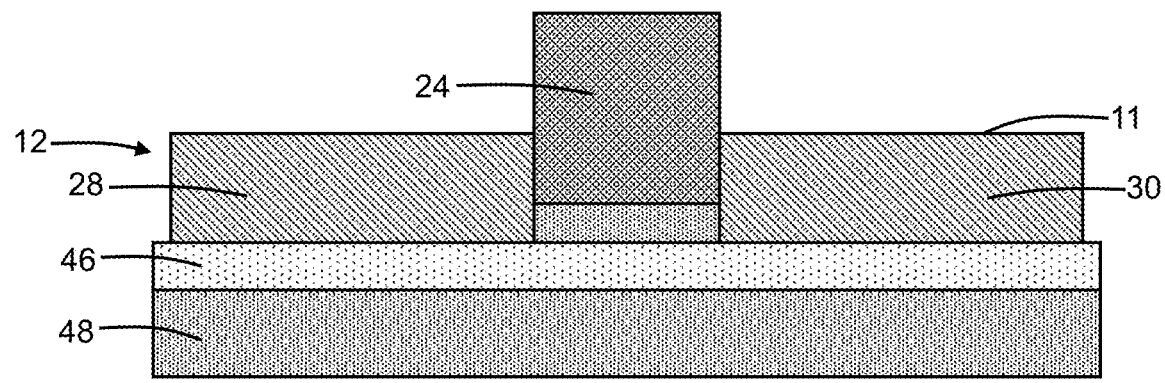
FIG. 4A is a cross-sectional view taken generally along line 4A-4A in FIG. 3.
Figure 5:
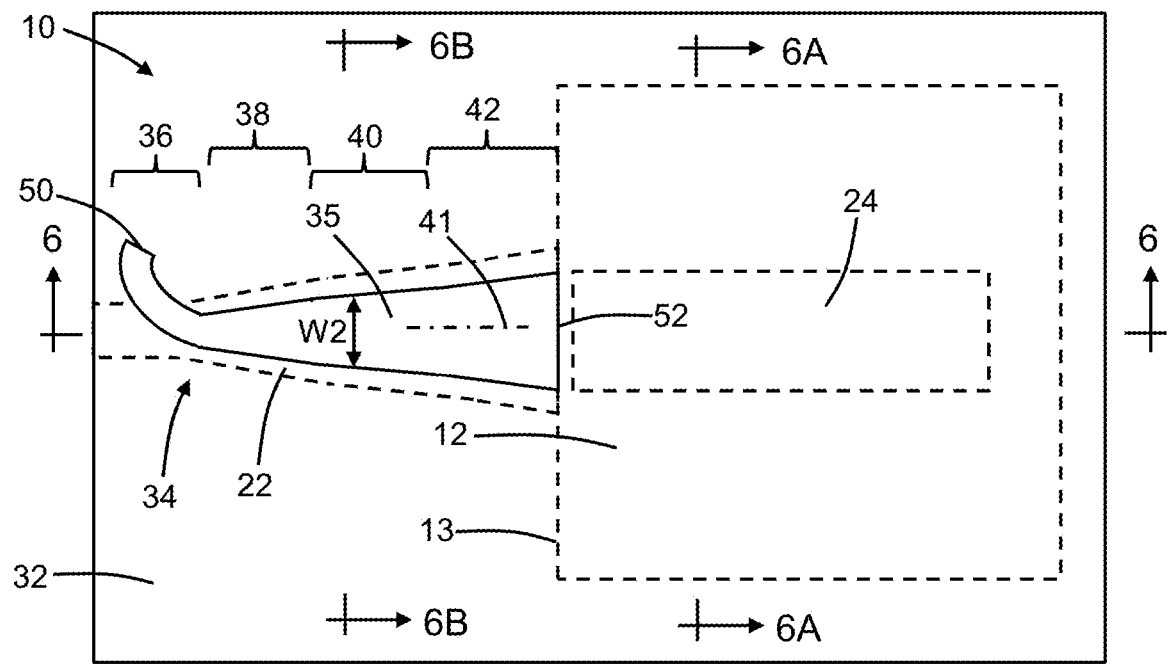
FIG. 5 is a top view of the structure at a fabrication stage of the processing method subsequent to FIG. 3.
Figure 6:
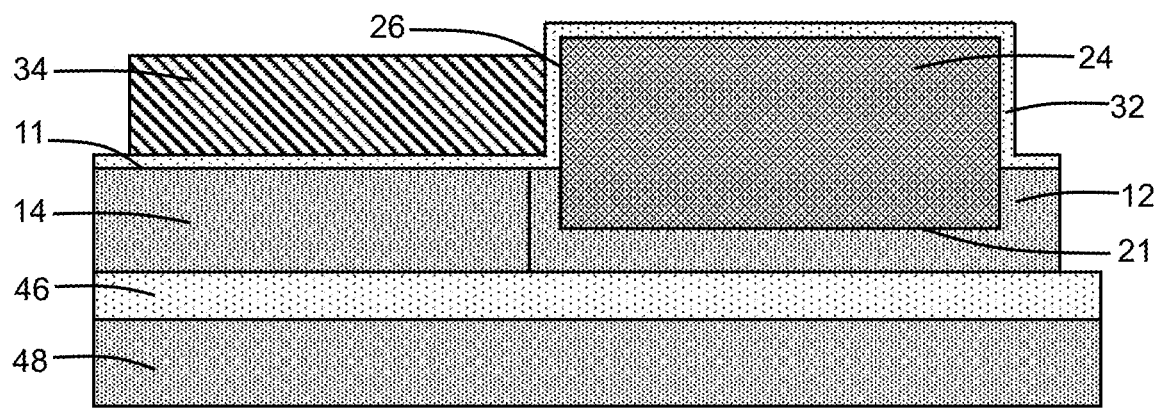
FIG. 6 is a cross-sectional view taken generally along line 6-6 in FIG. 5.
Figure 6A:
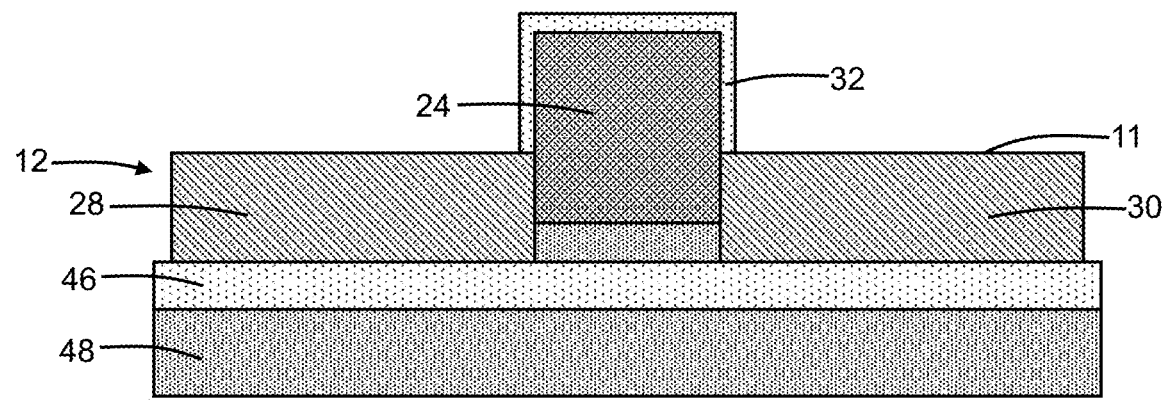
FIG. 6A is a cross-sectional view taken generally along line 6A-6A in FIG. 5.
Figure 6B:
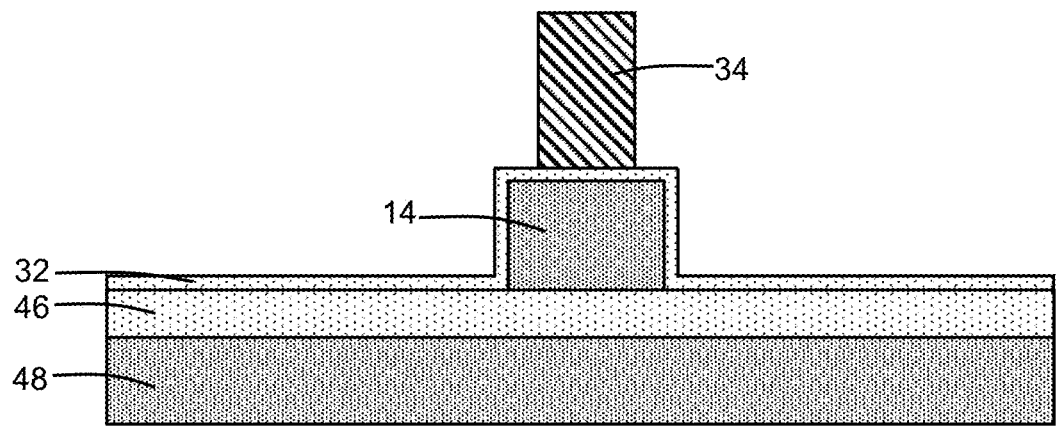
FIG. 6B is a cross-sectional view taken generally along line 6B-6B in FIG. 5.

With reference to FIGS. 3, 4, 4A in which like reference numerals refer to like features in FIGS. 1, 2, 2A and at a subsequent fabrication stage, a trench 21 may be etched in the pad 12 using a patterned hardmask (not shown) as an etch mask, and a semiconductor layer 24 may be subsequently formed inside the trench 21. The trench 21 may penetrate only partially through the thickness of the pad 12. In an embodiment, the semiconductor layer 24 may be epitaxially grown inside the trench 21. In an embodiment, the semiconductor layer 24 may be formed by a selective epitaxial growth process such that the semiconductor layer 24 forms inside the trench 21 but not on the patterned hardmask.

The semiconductor layer 24 may include an upper portion that projects, or has a height H that extends, above the top surface 11 of the pad 12 and waveguide core 14, and a lower portion that is arranged below the top surface 11 of the pad 12 and waveguide core 14 due to formation inside the trench 21. The upper portion of the semiconductor layer 24 includes a sidewall 26 that is arranged adjacent to the tapered section 20 of the waveguide core 14 and adjacent to the side edge 13 of the pad 12.

In an embodiment, the semiconductor layer 24 may define a light-absorbing region of a photodetector. The semiconductor layer 24 may be comprised of a different material than either the pad 12 and/or the waveguide core 14. In particular, the semiconductor layer 24 may be comprised of a material that has a higher refractive index than the material of either the pad 12 and/or the waveguide core 14. The semiconductor layer 24 may be comprised of a material that absorbs light and generates charge carriers from the absorbed light, whereas the waveguide core 14 may be comprised of a material that guides light to the semiconductor layer 24. In an embodiment, the semiconductor layer 24 may comprise a material having a composition that includes germanium. In an embodiment, the semiconductor layer 24 may comprise a material having a composition that exclusively includes germanium disregarding trace elements.

A doped region 28 and a doped region 30 may be formed in respective portions of the pad 12. The doped regions 28, 30 may extend through the entire thickness of the pad 12 to the underlying dielectric layer 46. The doped region 28 and the doped region 30, which have opposite conductivity types, may respectively define an anode and a cathode of the photodetector that also includes the semiconductor layer 24 as the light-absorbing region.

The doped region 28 may be formed by, for example, ion implantation with an implantation mask having an opening that determines the implanted area of the pad 12. The implantation mask may include a layer of a light-sensitive material, such as a photoresist, applied by a spin-coating process, pre-baked, exposed to light projected through a photomask, baked after exposure, and developed with a chemical developer to define an opening arranged over the area of the pad 12 to be implanted. The implantation conditions (e.g., ion species, dose, kinetic energy) may be selected to tune the electrical and physical characteristics of the doped region 28. The implantation mask may be stripped after forming the doped region 28. In an embodiment, the semiconductor material of the doped region 28 may contain a p-type dopant (e.g., boron) that provides p-type electrical conductivity.

The doped region 30 may be formed by, for example, ion implantation with an implantation mask having an opening that determines the implanted area of the pad 12. The implantation mask may include a layer of a light-sensitive material, such as a photoresist, applied by a spin-coating process, pre-baked, exposed to light projected through a photomask, baked after exposure, and developed with a chemical developer to define openings arranged over the area of the pad 12 to be implanted. The implantation conditions (e.g., ion species, dose, kinetic energy) may be selected to tune the electrical and physical characteristics of the doped region 30. The implantation mask may be stripped after forming the doped region 30. In an embodiment, the semiconductor material of the doped region 30 may contain an n-type dopant (e.g., phosphorus and/or arsenic) that provides n-type electrical conductivity.

With reference to FIGS. 5, 6, 6A, 6B in which like reference numerals refer to like features in FIGS. 4, 4A and at a subsequent fabrication stage, a dielectric layer 32 is formed on the pad 12, waveguide core 14, and semiconductor layer 24. In an embodiment, the dielectric layer 32 may be comprised of silicon dioxide on the pad 12 and waveguide core 14, and the dielectric layer 32 may be comprised of a germanium oxide on the semiconductor layer 24.

A waveguide core 34 is formed on the dielectric layer 32 over the waveguide core 14. In an embodiment, the waveguide core 34 may comprise a polycrystalline semiconductor material, such as polycrystalline silicon (i.e., polysilicon). The waveguide core 34 may be patterned by depositing a layer of the polycrystalline semiconductor material, applying an etch mask, and etching the polycrystalline semiconductor material with an etching process, such as a reactive ion etching process. In an alternative embodiment, the waveguide core 34 may be patterned from the polycrystalline semiconductor layer by lithography and etching processes without etching fully through the polycrystalline semiconductor layer to initially form an unpatterned slab layer and, subsequently, the slab layer may be patterned to shape with a separate set of lithography and etching processes from the partially-etched portions of the polycrystalline semiconductor layer. In an embodiment, the semiconductor materials of the waveguide core 14 and the waveguide core 34 may have equal refractive indices. In an embodiment, the semiconductor materials of the waveguide core 14 and the waveguide core 34 may have substantially equal refractive indices.

In an embodiment, the waveguide core 34 may be segmented into a curved section 36 and a taper 35 that includes tapered sections 38, 40, 42. The tapered sections 38, 40, 42 are serially arranged along a longitudinal axis 41 with the tapered section 40 between the tapered section 38 and the tapered section 42. The tapered sections 38, 40, 42 of the taper 35 are longitudinally positioned between the sidewall 26 of the semiconductor layer 24 and the curved section 36. In an embodiment, the taper 35 of the waveguide core 34 may fully overlap with the taper 22 of the waveguide core 14. The taper 22 of the waveguide core 14 is positioned in a vertical direction between the taper 35 of the waveguide core 34 and the dielectric layer 46.

The waveguide core 34 terminates at opposite ends 50, 52 in which the end 50 terminates the curved section 36 and the end 52 terminates the taper 35. The end 52 of the waveguide core 34 abuts the semiconductor layer 24 with a portion of the dielectric layer 32 positioned between the tapered section 42 of the waveguide core 34 and the abutted end 52. In an embodiment, the tapered sections 38, 40, 42 may have unequal taper angles. In an embodiment, the taper angle of the tapered section 40 may be less than the taper angle of the tapered section 38, and the taper angle of the tapered section 42 may be greater than the taper angle of the tapered section 40. In an embodiment, the taper 35 may be centered over the taper 22. In an alternative embodiment, the taper 35 may be laterally offset relative to the taper 22.

The curved section 36 defines a bend that terminates the waveguide core 34 at end 50 as a leading curved tip. The curved section 36 may partially overlap with the waveguide core 14. In that regard, the curved section 36 may curve in a lateral direction away from the longitudinal axis 41 with an end portion that is laterally displaced (i.e., offset) from a side edge of the waveguide core 14 and that terminates at the end 50. The curved section 36 has an overlapping portion that overlaps with the waveguide core 14 and a non-overlapping portion that does not overlap with the waveguide core 14. The end 50 of the waveguide core 34, which terminates the curved section 36, is blunt and non-pointed, which may improve the manufacturability of the taper 35.

The taper 35 may improve confinement of light propagating in the taper 22 before absorption of the light by the semiconductor layer 24. The curved section 36 reduces the abruptness of the transition of light from the waveguide core 14 to the semiconductor layer 24. The lateral displacement (i.e., offset) provided by the curved section 36 becomes smaller (i.e., decreases) with decreasing distance from the taper 35 to provide a gradual transition, and the lateral displacement provided by the curved section 36 ends at the transition from the curved section 36 to the taper 35.

The width dimension W2 of the taper 35 of the waveguide core 34 varies with position (i.e., tapers) along the longitudinal axis 41. In an embodiment, the width dimension W2 of the taper 35 may be considered to inversely taper in a direction of light propagation toward the semiconductor layer 24. In an embodiment, the width dimension W2 of the taper 35 may decrease with increasing distance from the semiconductor layer 24. In an embodiment, the width dimension W2 of the tapered section 42 may decrease with increasing distance from the semiconductor layer 24, the width dimension W2 of the tapered section 40 may decrease with increasing distance from the tapered section 42, and the width dimension W2 of the tapered section 38 may decrease with increasing distance from the tapered section 40. In an embodiment, the tapered sections 38, 40, 42 may have polygonal shapes. In an embodiment, the width dimension W2 of the tapered sections 38, 40, 42 may vary based on a linear function. In an alternative embodiment, the width dimension W2 of the tapered sections 38, 40, 42 may vary based on a non-linear function, such as a quadratic, parabolic, or exponential function.

Dielectric layers comprised of silicon dioxide and silicon nitride may be deposited that conformally cover the pad 12, waveguide core 14, semiconductor layer 24, and waveguide core 34. Middle-of-line (MOL) processing and back-end-of-line (BEOL) processing follow, which includes formation of additional dielectric layers, silicide, contacts, vias, and wiring for an interconnect structure that is coupled with the photodetector. In particular, contacts are formed that are connected to the doped regions 28, 30.

In use, light may be guided by the waveguide core 14 to the semiconductor layer 24. The waveguide core 14 may support propagation of light with transverse electric polarization mode, transverse magnetic polarization mode, or a combination of both. The semiconductor layer 24 absorbs photons of the light and converts the absorbed photons into charge carriers. The biasing of the doped regions 28, 30 causes the charge carriers to be collected and output from the photodetector to provide, as a function of time, a measurable photocurrent. In an embodiment, the light may originate from a laser and may be modulated as an optical signal.

The taper 35 of the waveguide core 34 and the taper 22 of the waveguide core 14, which have an overlapping relationship, may function to improve the coupling efficiency between the waveguide core 14 and the semiconductor layer 24. Light confinement and modal effective index may be improved by the overlapped tapers 22, 35 of the waveguide cores 14, 34 such that modal overlap and coupling with the semiconductor layer 24 are increased. The curved section 36 of the waveguide core 34 may be effective to suppress perturbation and crosstalk to higher order modes, which may enhance the responsivity of the semiconductor layer 24 to transverse magnetic polarized light. The waveguide cores 14, 34 such may enable gradual overlay and enable adiabatic mode conversion in the transition of propagating light from the waveguide core 14 to the semiconductor layer 24.

Figure 7:
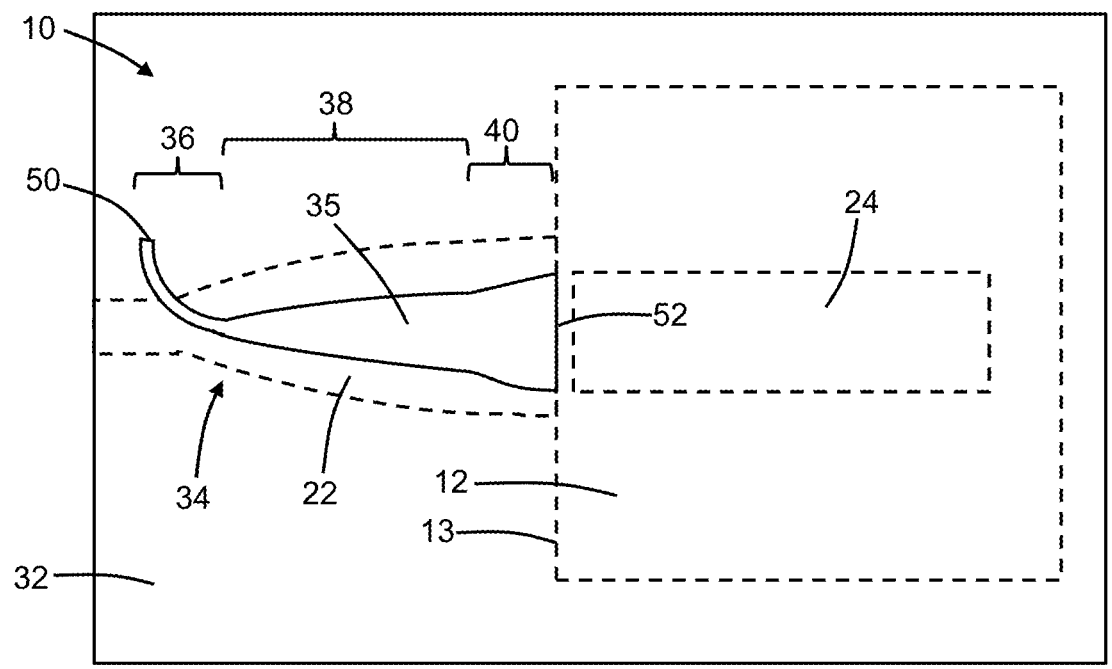
FIG. 7 is a top view of a structure in accordance with alternative embodiments of the invention.

With reference to FIG. 7 and in accordance with alternative embodiments, the taper 22 may include a single tapered section characterized by a width dimension that varies based on a non-linear function, such as a quadratic, parabolic, or exponential function, and the taper 35 may include tapered sections 38, 40 characterized by respective width dimensions that vary based on a non-linear function, such as a quadratic, parabolic, or exponential function. The non-linear functions providing the shapes of the taper 22 and the taper 35 may differ from each other.

In an alternative embodiment, the taper 22 may include the tapered sections 16, 18, 20 having respective width dimensions that vary according to a linear function. In an alternative embodiment, the taper 22 may include the tapered sections 16, 18, 20 having respective width dimensions that vary according to a non-linear function.

Figure 8:
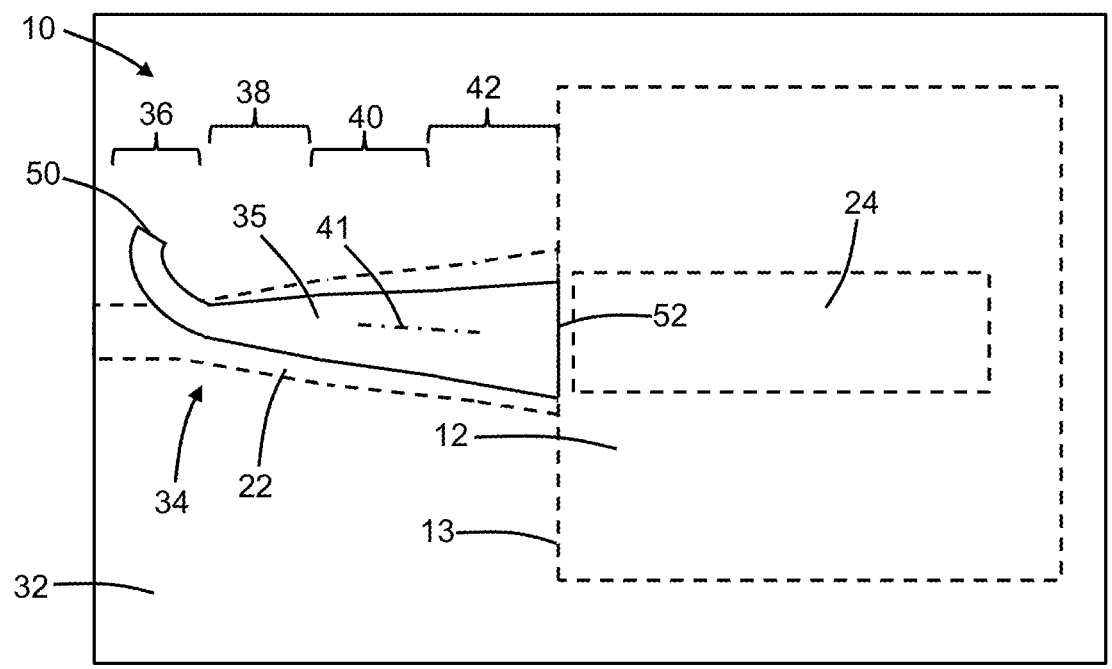
FIG. 8 is a top view of a structure in accordance with alternative embodiments of the invention.

With reference to FIG. 8 and in accordance with alternative embodiments, the waveguide core 34 may be tilted at an angle such that the longitudinal axis 41 is inclined relative to the longitudinal axis 15. The tilting of the taper 35 of the waveguide core 34 relative to the taper 22 of the waveguide core 14 may be effective to reduce optical return loss.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first waveguide core including a first taper;
    a semiconductor layer having a sidewall adjacent to the first taper; and
    a second waveguide core including a curved section and a second taper that is positioned to overlap with the first taper, the second taper longitudinally positioned between the sidewall of the semiconductor layer and the curved section, and the curved section terminating the second waveguide core.

2. The structure of claim 1 wherein the first taper comprises single-crystal silicon, the second taper comprises polysilicon, and the semiconductor layer comprises germanium.

3. The structure of claim 1 wherein the curved section partially overlaps with the first waveguide core.

4. The structure of claim 3 wherein the second taper fully overlaps the first taper.

5. The structure of claim 4 wherein the second waveguide core has a first end and a second end, the curved section terminates the second waveguide core at the first end, the second taper terminates the second waveguide core at the second end, and the second end of the second waveguide core is positioned adjacent to the sidewall of the semiconductor layer.

6. The structure of claim 5 wherein the second end of the second taper abuts the sidewall of the semiconductor layer.

7. The structure of claim 1 wherein the second taper has a longitudinal axis, and the curved section curves laterally away from the longitudinal axis.

8. The structure of claim 1 wherein the first taper includes a first plurality of tapered sections, and the second taper includes a second plurality of tapered sections.

9. The structure of claim 8 wherein the second taper has a width dimension that decreases with increasing distance from the sidewall of the semiconductor layer, and the second taper has a width dimension that decreases with increasing distance from the sidewall of the semiconductor layer.

10. The structure of claim 1 wherein the second taper has a plurality of tapered sections, and each tapered section has a width dimension that varies according to a first non-linear function.

11. The structure of claim 10 wherein the first taper has a width dimension that varies according to a second non-linear function different from the first non-linear function.

12. The structure of claim 1 wherein the second taper has a plurality of tapered sections, and each tapered section of the second taper has a first width dimension that varies according to a first linear function.

13. The structure of claim 12 wherein the first taper has a plurality of tapered sections, and each tapered section of the first taper has a second width dimension that varies according to a second linear function.

14. The structure of claim 1 wherein the second taper is centered over the first taper.

15. A method comprising:
    forming a first waveguide core including a first taper;
    forming a semiconductor layer having a sidewall adjacent to the first taper; and
    forming a second waveguide core including a curved section and a second taper that is positioned to overlap with the first taper, wherein the second taper is longitudinally positioned between the sidewall of the semiconductor layer and the curved section, and the curved section terminates the second waveguide core.

16. The method of claim 15 wherein the first taper comprises single-crystal silicon, the second taper comprises polysilicon, and the semiconductor layer comprises germanium.

17. The method of claim 15 wherein the curved section partially overlaps with the first waveguide core.

18. The method of claim 17 wherein the second taper fully overlaps the first taper.

19. The method of claim 18 wherein the second waveguide core has a first end and a second end, the curved section terminates the second waveguide core at the first end, the second taper terminates the second waveguide core at the second end, and the second end of the second waveguide core is positioned adjacent to the sidewall of the semiconductor layer.

20. The method of claim 15 wherein the first taper includes a first plurality of tapered sections, and the second taper includes a second plurality of tapered sections.

* * * * *